United States Patent
Tutt et al.

(10) Patent No.: US 6,939,660 B2
(45) Date of Patent: Sep. 6, 2005

(54) LASER THERMAL TRANSFER DONOR INCLUDING A SEPARATE DOPANT LAYER

(75) Inventors: Lee W. Tutt, Webster, NY (US); Myron W. Culver, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 389 days.

(21) Appl. No.: 10/210,934

(22) Filed: Aug. 2, 2002

(65) Prior Publication Data

US 2004/0029039 A1 Feb. 12, 2004

(51) Int. Cl.⁷ .................................................. G03C 8/00
(52) U.S. Cl. .................... 430/200; 430/201; 430/273.1; 430/944; 430/945
(58) Field of Search ................................. 430/321, 200, 430/201, 945, 271.1, 273.1, 964, 944; 427/66

(56) References Cited

U.S. PATENT DOCUMENTS

| | | |
|---|---|---|
| 3,180,730 A | 4/1965 | Klupfel et al. |
| 3,567,450 A | 3/1971 | Brantly et al. |
| 3,658,520 A | 4/1972 | Brantly et al. |
| 4,356,429 A | 10/1982 | Tang |
| 4,539,507 A | 9/1985 | Van Slyke et al. |
| 4,720,432 A | 1/1988 | Van Slyke et al. |
| 4,768,292 A | 9/1988 | Manzei |
| 4,769,292 A | 9/1988 | Tang et al. |
| 4,772,582 A | 9/1988 | DeBoer |
| 4,885,221 A | 12/1989 | Tsuneeda |
| 5,059,861 A | 10/1991 | Littman et al. |
| 5,059,862 A | 10/1991 | Van Slyke et al. |
| 5,061,569 A | 10/1991 | Van Slyke et al. |
| 5,141,671 A | 8/1992 | Bryan et al. |
| 5,150,006 A | 9/1992 | Van Slyke et al. |
| 5,151,629 A | 9/1992 | Van Slyke |
| 5,294,870 A | 3/1994 | Tang et al. |
| 5,405,709 A | 4/1995 | Littman et al. |
| 5,484,922 A | 1/1996 | Moore et al. |
| 5,578,416 A | 11/1996 | Tutt |
| 5,593,788 A | 1/1997 | Shi et al. |
| 5,645,948 A | 7/1997 | Shi et al. |
| 5,677,572 A | 10/1997 | Hung et al. |
| 5,683,823 A | 11/1997 | Shi et al. |
| 5,688,551 A | 11/1997 | Littman et al. |
| 5,742,129 A | 4/1998 | Nagayama et al. |

(Continued)

FOREIGN PATENT DOCUMENTS

| | | |
|---|---|---|
| EP | 0 891 121 | 1/1999 |
| EP | 0 732 868 | 5/2000 |
| EP | 1 009 041 | 6/2000 |
| EP | 1029909 | 8/2000 |
| WO | WO 98/55561 | 12/1998 |
| WO | WO 00/18851 | 4/2000 |
| WO | WO 00/57676 | 9/2000 |
| WO | WO 00/70655 | 11/2000 |

OTHER PUBLICATIONS

Handbook of Conductive Molecules and Polymers, vols. 1–4, H.S. Nalwa, ed., John Wiley and Sons, Chichester (1997).

*Primary Examiner*—Thorl Chea
(74) *Attorney, Agent, or Firm*—Raymond L. Owens

(57) ABSTRACT

A donor element adapted for use in making an OLED device including a donor support element; a light-absorbing layer disposed over the donor support element, which in response to light, produces heat; a host material layer disposed over the light-absorbing layer; and a dopant layer disposed over the host material layer such that when the donor element is placed in a transfer relationship with the OLED device and when light is absorbed by the light-absorbing layer, heat is produced that causes the vaporization transfer of host materials and dopant materials from the light-absorbing layer to cause at least partial mixing in the OLED device.

15 Claims, 4 Drawing Sheets

U.S. PATENT DOCUMENTS

| | | |
|---|---|---|
| 5,755,999 A | 5/1998 | Shi et al. |
| 5,776,623 A | 7/1998 | Hung et al. |
| 5,851,709 A | 12/1998 | Grande et al. |
| 5,928,802 A | 7/1999 | Shi et al. |
| 5,935,720 A | 8/1999 | Chen et al. |
| 5,935,721 A | 8/1999 | Shi et al. |
| 6,020,078 A | 2/2000 | Chen et al. |
| 6,048,573 A * | 4/2000 | Tang et al. .................. 427/66 |
| 6,114,088 A | 9/2000 | Wolk et al. |
| 6,140,009 A | 10/2000 | Wolk et al. |
| 6,140,763 A | 10/2000 | Hung et al. |
| 6,194,119 B1 | 2/2001 | Wolk et al. |
| 6,208,075 B1 | 3/2001 | Hung et al. |
| 6,214,520 B1 | 4/2001 | Wolk et al. |
| 6,221,553 B1 | 4/2001 | Wolk et al. |

* cited by examiner

LASER THERMAL TRANSFER DONOR INCLUDING A SEPARATE DOPANT LAYER

CROSS REFERENCE TO RELATED APPLICATIONS

Reference is made to commonly assigned U.S. patent application Ser. No. 10/060,837 filed Jan. 30, 2002 by Mitchell S. Burberry et al., entitled "Using Spacer Elements to Make Electroluminescent Display Devices"; commonly assigned U.S. patent application Ser. No. 10/021,410 filed Dec. 12, 2001 by Bradley A. Phillips et al., entitled "Apparatus for Permitting Transfer of Organic Material From a Donor to Form a Layer in an OLED Device"; and commonly assigned U.S. patent application Ser. No. 10/211,213 filed Aug. 2, 2002 by Myron W. Culver et al., entitled "Laser Thermal Transfer From a Donor Element Containing a Hole-Transporting Layer", the disclosures of which are herein incorporated by reference.

FIELD OF THE INVENTION

The present invention relates to a donor element and a method for making organic electroluminescent (EL) devices, also known as organic light-emitting diodes (OLED).

BACKGROUND OF THE INVENTION

In color or full color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electronic transport layer (for electron transport). In forming the RGB pixels in a full color OLED display panel, it is necessary to devise a method to precisely pattern the emissive layer of the organic EL medium or the entire organic EL medium.

Typically, electroluminescent pixels are formed on the display by shadow masking techniques such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels.

Donor materials have been known for many years for the purpose of laser thermal dye transfer of images as taught in U.S. Pat. No. 4,772,582 and references therein. The process uses donor sheets to transfer different colors using a laser beam to heat up and thermally transfer dyes from the donor to the receiver. This method is used for high quality images but does not teach the transfer of EL materials.

A suitable method for patterning high resolution OLED displays has been disclosed in U.S. Pat. No. 5,851,709 by Grande et al. This method is comprised of the following sequences of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate with an array of openings extending from the second surface to the heat-insulating layer; 5) providing a transferable color forming organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. Another problem is the requirement for precision mechanical alignment between the donor substrate and the display substrate. A further problem is that the donor pattern is fixed and cannot be changed readily.

Littman and Tang (U.S. Pat. No. 5,688,551) teach the patternwise transfer of organic EL material from an unpatterned donor sheet to an EL substrate. A series of patents by Wolk et al. (U.S. Pat. Nos. 6,114,088; 6,140,009; 6,214,520; and 6,221,553) teach a method that can transfer the luminescent layer of an EL device from a donor element to a substrate by heating selected portions of the donor with a laser beam. Each layer is an operational or nonoperational layer that is utilized in the function of the device.

In these processes a donor containing the electroluminescent materials is heated by radiation and transferred to a receiver which may already contain a portion of the active device. The device may then be finished by the application of further layers. This process allows the patterning of colors by the use of a suitable donor which contains an electron or hole conductors host and a dopant. The final light emitting device must have the dopant mixed together to give a good emission. It is difficult to coevaporate two or more materials simultaneously and maintain a constant controlled ratio. The resulting emission from these radiation-transferred devices also have need for improved efficiency.

SUMMARY OF THE INVENTION

It is an object of this invention to allow good control of a dopant/host ratio for manufacture of a donor. It is also an object of this invention to give good color and efficiency in a device manufactured through the use of this invention.

This object is achieved by a donor element adapted for use in making an OLED device, comprising:

a) a donor support element;

b) a light-absorbing layer disposed over the donor support element which, in response to light, produces heat;

c) a host material layer disposed over the light-absorbing layer; and d) a dopant layer disposed over the host material layer such that when the donor element is placed in a transfer relationship with the OLED device and when light is absorbed by the light-absorbing layer, heat is produced that causes the vaporization transfer of host materials and dopant materials from the light-absorbing layer to cause at least partial mixing in the OLED device.

ADVANTAGES

A donor for use in laser thermal OLED transfer is constructed which has the dopant in a separate layer from the host on an absorber/substrate. Each layer by itself is a nonoperational layer in the final device, if used separately. Upon transfer the dopant is sufficiently mixed to activate it and allow a clean efficient color to be generated in a single operational layer (the emission layer). This allows donors to be made as layers rather than as mixed layers which simplifies the manufacture.

The donor material is easier and simpler to manufacture since one can control the absolute laydown of the dopant and host separately and independent of the deposition rate.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least two colors. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary color from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1A:
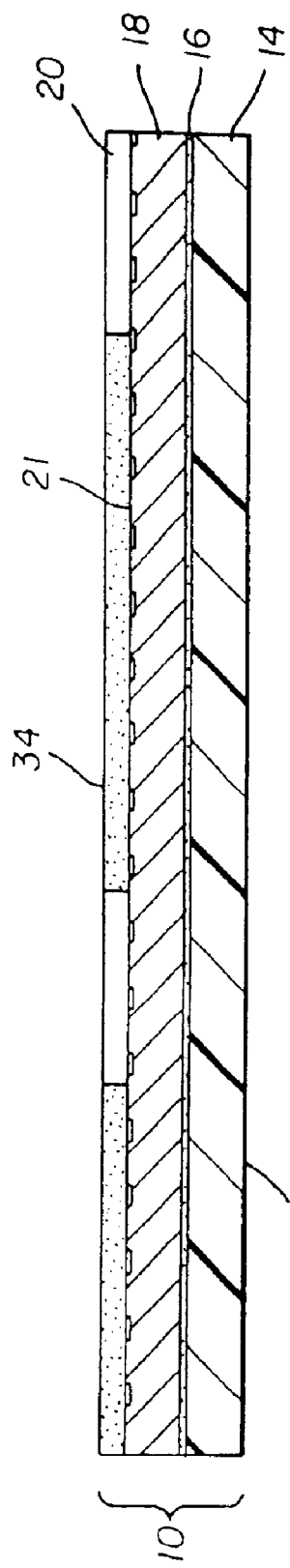
FIG. 1a shows one embodiment of the structure of a donor element prepared in accordance with this invention.

FIG. 1a shows in cross-sectional view one embodiment of the structure of a donor element 10. Donor element 10 includes at the minimum a flexible donor support element 14, which comprises the non-transfer surface 32 of donor element 10. Donor support element 14 can be made of any of several materials which meet at least the following requirements: The donor support element 14 must be capable of maintaining the structural integrity during the light-to-heat-induced transfer step while pressurized on one side, and during any preheating steps contemplated to remove volatile constituents such as water vapor. Additionally, the donor support element 14 must be capable of receiving on one surface a relatively thin coating of organic donor material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic donor materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support can require a multistep cleaning and surface preparation process prior to precoating with transferable organic material. If the support material is a radiation-transmissive material, the incorporation into the support or onto a surface thereof, of a radiation-absorptive material can be advantageous to more effectively heat the donor support and to provide a correspondingly enhanced transfer of transferable organic donor material from the support to the substrate, when using a flash of radiation from a suitable flash lamp or laser light from a suitable laser.

A light-absorbing layer 16 is disposed over donor support element 14. Light-absorbing layer 16 can be disposed on donor support element 14, or can be disposed over intervening layers. Light-absorbing layer 16 is capable of absorbing light in a predetermined portion of the spectrum, and in response to such light, producing heat. Light-absorbing layer 16 can comprise a dye such as the dyes specified in U.S. Pat. No. 5,578,416, a pigment such as carbon, or a metal such as nickel, chromium, titanium, etc.

Donor element 10 further includes a host material in host material layer 18, which is disposed either directly on light-absorbing layer 16 or over intervening layers. Host materials can include hole-transporting material or electron-transporting material. In the OLED device, the host material serves to dilute the dopant material and thereby inhibit self-quenching. The host also can modify the emissive characteristic of the dopant to achieve different hues.

Hole-transporting materials useful as host materials are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural

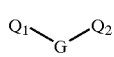

A wherein:

$Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula (A) and containing two triarylamine moieties is represented by structural Formula (B).

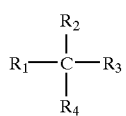

B where:

$R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural

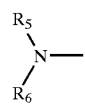

C wherein:

$R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D).

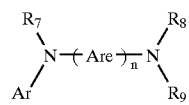

D wherein:

each Are is an independently selected arylene group, such as a phenylene or anthracene moiety;

n is an integer of from 1 to 4; and

Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae (A), (B), (C), (D) can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl 2,6-Bis[N,N-di(2-naphthyl)amine]fluorene 1,5-Bis[N-(1-naphthyl)-N-phenylamino]naphthalene Another class of useful hole-transport materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Electron transporting materials useful as host materials include metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

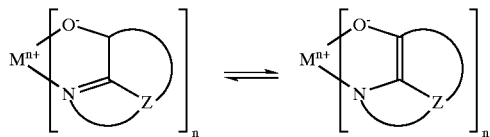

E wherein:

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange, or red.

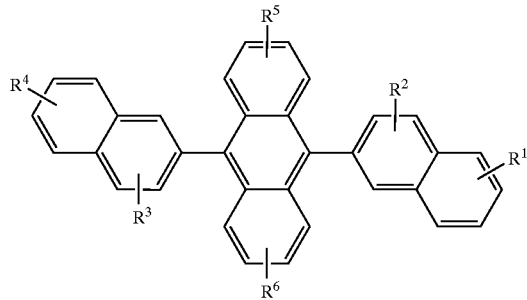

F wherein:

$R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange, or red.

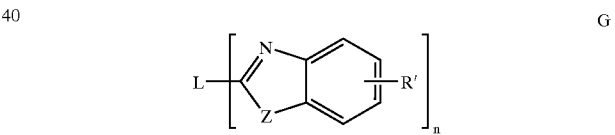

G where:

n is an integer of 3 to 8;

Z is O, NR or S;

R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:
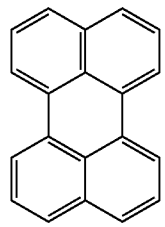
L1
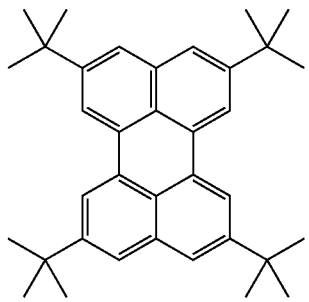
L2
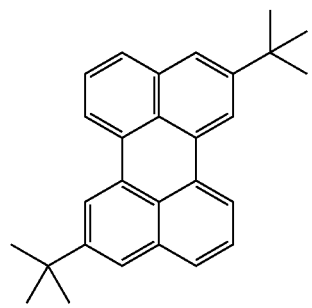
L3
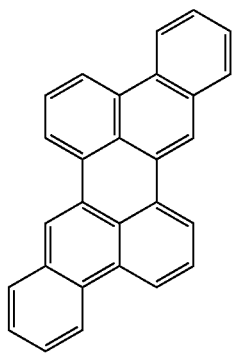
L4
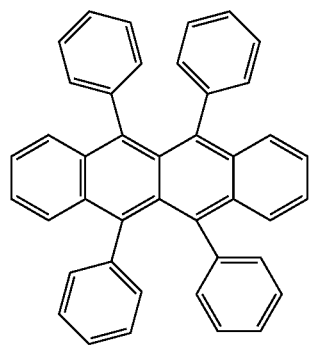
L5
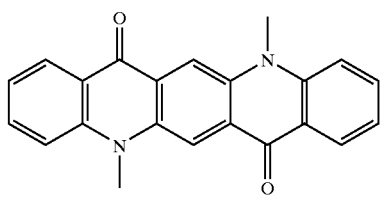
L6
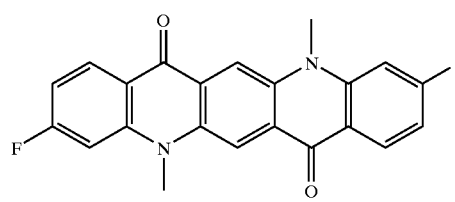
L7
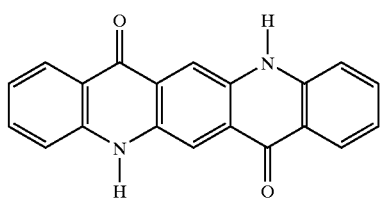
L8

-continued

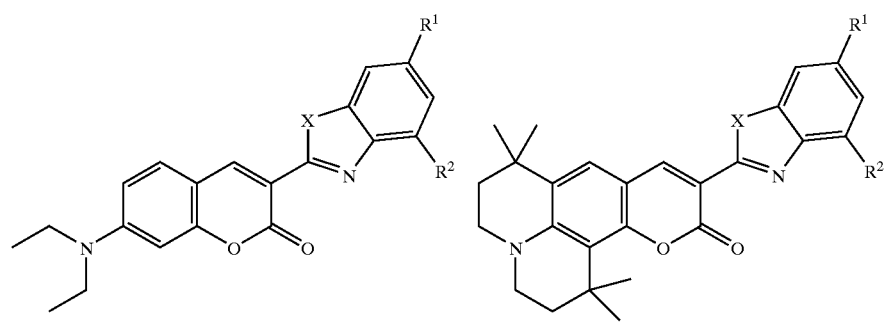

|     | X | R1     | R2     |     | X | R1     | R2     |
|-----|---|--------|--------|-----|---|--------|--------|
| L9  | O | H      | H      | L23 | O | H      | H      |
| L10 | O | H      | Methyl | L24 | O | H      | Methyl |
| L11 | O | Methyl | H      | L25 | O | Methyl | H      |
| L12 | O | Methyl | Methyl | L26 | O | Methyl | Methyl |
| L13 | O | H      | t-butyl| L27 | O | H      | t-butyl|
| L14 | O | t-butyl| H      | L28 | O | t-butyl| H      |
| L15 | O | t-butyl| t-butyl| L29 | O | t-butyl| t-butyl|
| L16 | S | H      | H      | L30 | S | H      | H      |
| L17 | S | H      | Methyl | L31 | S | H      | Methyl |
| L18 | S | Methyl | H      | L32 | S | Methyl | H      |
| L19 | S | Methyl | Methyl | L33 | S | Methyl | Methyl |
| L20 | S | H      | t-butyl| L34 | S | H      | t-butyl|
| L21 | S | t-butyl| H      | L35 | S | t-butyl| H      |
| L22 | S | t-butyl| t-butyl| L36 | S | t-butyl| t-butyl|

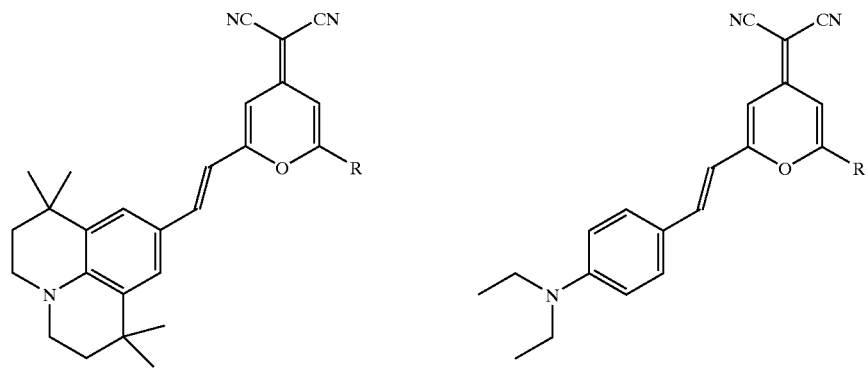

|     | R       |     | R       |
|-----|---------|-----|---------|
| L37 | phenyl  | L41 | phenyl  |
| L38 | methyl  | L42 | methyl  |
| L39 | t-butyl | L43 | t-butyl |
| L40 | mesityl | L44 | mesityl |

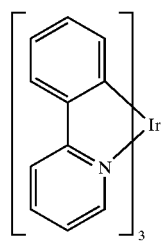

L45

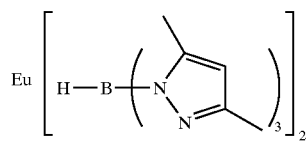

L46

-continued

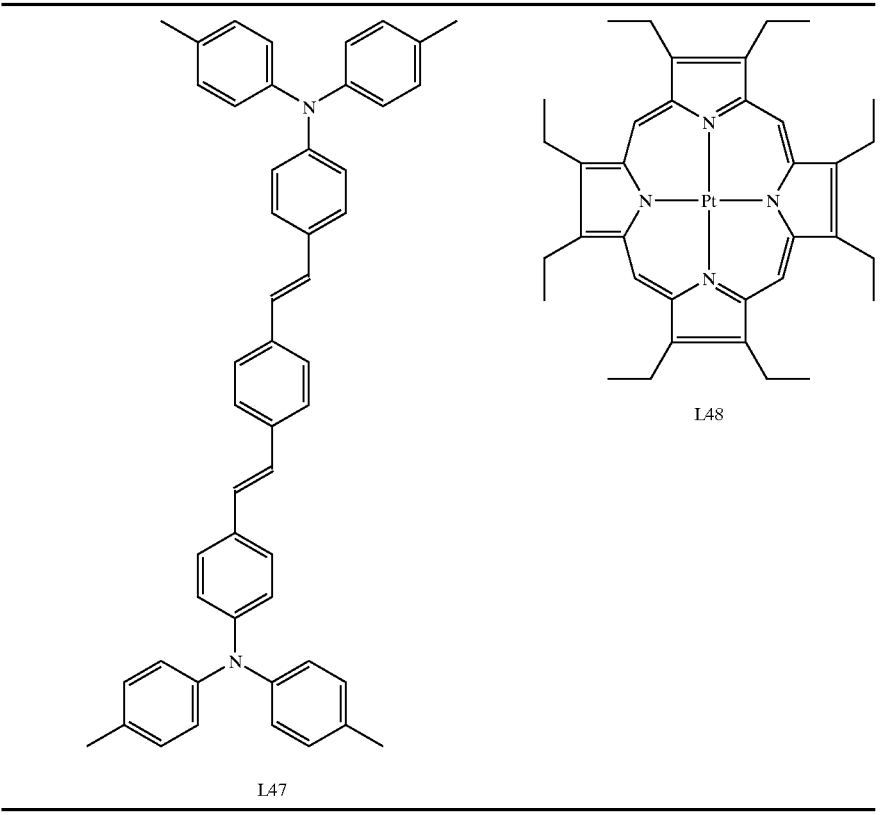

Other organic emissive materials can be polymeric substances, e.g. polyphenylenevinylene derivatives, dialkoxy-polyphenylenevinylenes, poly-paraphenylene derivatives, and polyfluorene derivatives, as taught by Wolk et al. in commonly assigned U.S. Pat. No. 6,194,119 B1 and references therein.

In an alternative embodiment, host material layer 18 can include two or more host materials. Alternatively, an additional host material can comprise another layer disposed over host material layer 18.

Donor element 10 further includes dopant layer 20, which is a covering layer over host material layer 18, and which comprises one or more dopant materials. Dopant layer 20 can be disposed over host material layer 18 and intervening layers or can be disposed directly on host material layer 18. When dopant layer 20 is disposed directly on host material layer 18, they form interface 21 between them. Donor support element 14 thus comprises non-transfer surface 32 and dopant layer 20 comprises transfer surface 34 of donor element 10. The dopant layer 20 is preferred to have a thickness of 0.01% to 10% the thickness of the host material layer 18. The host material layer 18 thickness is preferred to be between 2.5 nm to 100 nm and more preferably between 10 nm to 50 nm. The dopant material is usually chosen from highly fluorescent dyes, but phosphorescent compounds, e.g., transition metal complexes as described in WO 98/55561, WO 00/18851, WO 00/57676, and WO 00/70655 are also useful. Dopant materials are typically coated as 0.01 to 10% by weight relative to the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant material is smaller than that of the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Figure 1B:
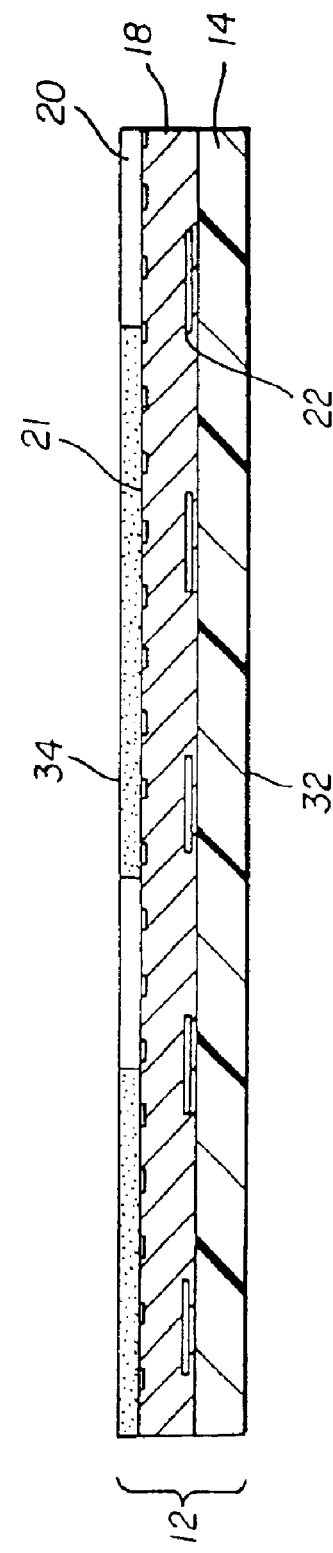
FIG. 1b shows another embodiment of the structure of a donor element prepared in accordance with this invention.

FIG. 1*b* shows in cross-sectional view another embodiment of the structure of a donor element 12. In this embodiment, donor support element 14 is first coated with radiation-absorbing patterned layer 22 capable of absorbing radiation in a predetermined portion of the spectrum to produce heat, then with host material layer 18, and finally dopant layer 20. Donor support element 14 then comprises non-transfer surface 32 and dopant layer 20 comprises transfer surface 34. Radiation-absorbing patterned layer 22 includes radiation-absorbing material capable of absorbing radiation in a predetermined portion of the spectrum and producing heat.

Figure 2A:
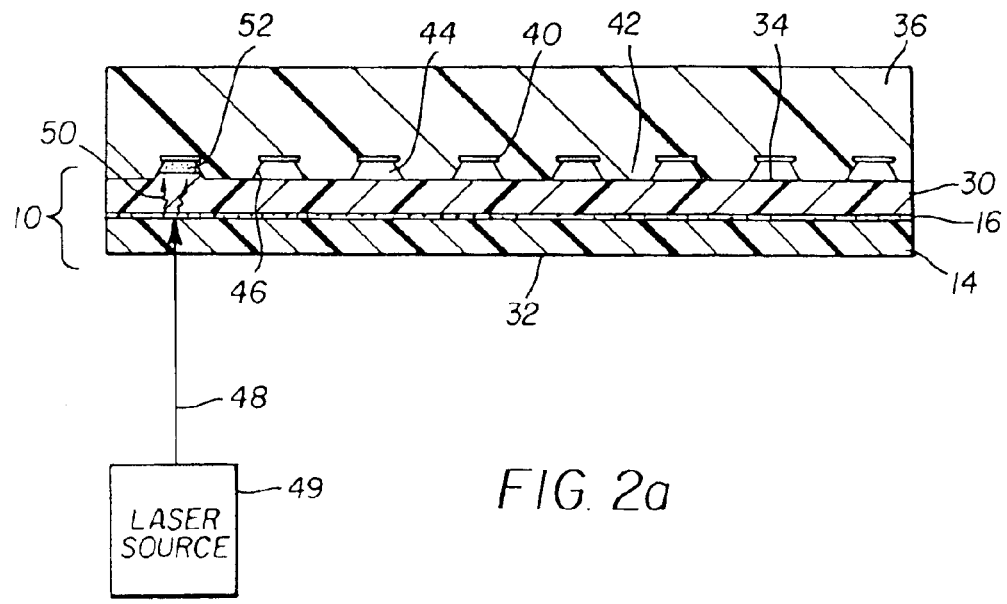
FIG. 2a shows a cross-sectional representation of the transfer of organic material from donor to substrate by one method of treatment with light.

FIG. 2*a* shows a cross-sectional representation of the process of vaporization transfer of organic material 30 from donor element 10 to portions of substrate 36 by one method of treatment with light. Vaporization transfer is herein defined as any mechanism such as sublimation, ablation, vaporization, or other process whereby material is transferred across a gap. Substrate 36 can be an organic solid, an inorganic solid, or a combination of organic and inorganic solids that provides a surface for receiving the emissive material from a donor and may be rigid or flexible. Typical substrate materials include glass, plastic, metal, ceramic, semiconductor, metal oxide, semiconductor oxide, semiconductor nitride, or combinations thereof. Substrate 36 may be a homogeneous mixture of materials, a composite of materials, or multiple layers of materials. Substrate 36 can be an OLED substrate, that is, a substrate commonly used for preparing OLED devices, e.g. active-matrix low-temperature polysilicon TFT substrate. The substrate 36 can either be light-transmissive or opaque, depending on the intended direction of light emission. The light-transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light-transmissive, light-absorbing, or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices. Substrate 36 can be coated with other layers prior to this step.

In this embodiment, donor element 10 has been prepared with light-absorbing layer 16. Light-absorbing layer 16 is placed in a transfer relationship with substrate 36, which can be an OLED device. By transfer relationship, it is meant that donor element 16 is positioned in contact with substrate 36 or is held with a controlled separation from substrate 36. In this embodiment, donor element 10 is in contact with substrate 36 and gap 44 is maintained by the structure of thin-film transistors 40 and intervening raised surface portions 42. Gap 44 has previously been described by commonly assigned U.S. patent application Ser. No. 10/060,837 filed Jan. 30, 2002 by Mitchell S. Burberry et al., entitled "Using Spacer Elements to Make Electroluminescent Display Devices", the disclosure of which is herein incorporated by reference.

A pattern of laser light 48 provided by laser source 49 illuminates non-transfer surface 32 of donor element 10. Laser source 49 can be, for example, an infrared laser of a power which is sufficient to cause enough heat to be formed to effect the transfer described herein. Heat 50 is produced when laser light 48 strikes light-absorbing layer 16. This heats organic material 30 in the immediate vicinity of laser light 48. Organic material 30 is drawn for clarity as a single layer, but it will be understood that it represents a multilayer coating as described herein, e.g. a dopant layer 20 disposed over a host material layer 18. In this embodiment, a large portion of the light impinging on donor element 10 will be converted to heat, but this will only happen at selectively irradiated portions of donor element 10. Light 48 is absorbed by light-absorbing layer 16, and heat 50 is produced. Some or all of the heated portion of organic material 30 is sublimed, vaporized, or ablated and becomes transferred organic material 52 on receiving surface 46 of substrate 36 in a patterned transfer. Thus, the vaporization transfer is effected of host materials and dopant materials, which comprise the various layers of organic material 30. When host materials and dopant materials are transferred from light-absorbing layer 16, they undergo at least partial mixing to become transferred organic material 52 in the OLED device.

Figure 2B:
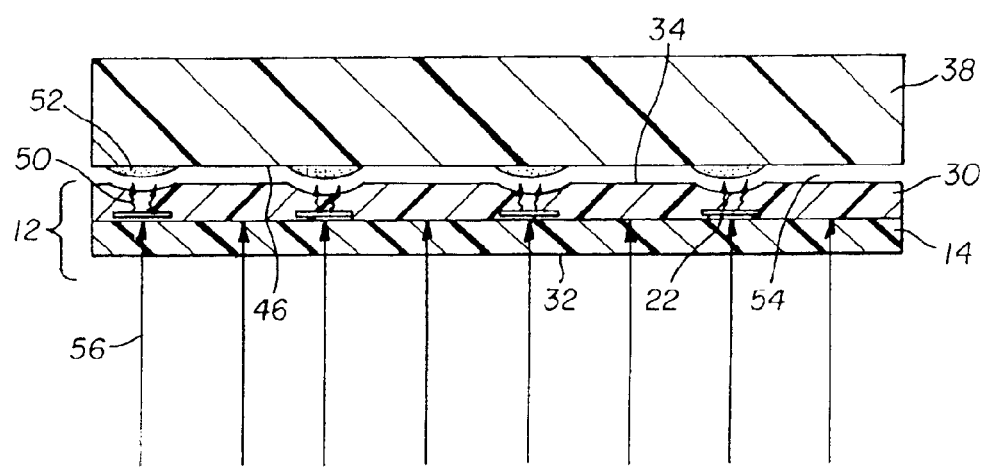
FIG. 2b shows a cross-sectional representation of the transfer of organic material from donor to substrate by another method of treatment with light.

FIG. 2b shows a cross-sectional representation of the transfer of organic material 30 from donor element 12 to portions of substrate 38, which can be an OLED substrate, by another method of treatment with light. In this embodiment, donor element 12 has been prepared with radiation-absorbing material 22 in a patterned layer. Donor element 12 is positioned in a transfer relationship with and spaced from substrate 38 by gap 54. Gap 54 can be maintained by methods such as those taught by Burberry et al. in commonly assigned U.S. patent application Ser. No. 10/060, 837 filed Jan. 30, 2002, entitled "Using Spacer Elements to Make Electroluminescent Display Devices", the disclosure of which is herein incorporated by reference. Flash light 56 irradiates non-transfer surface 32. Heat 50 is produced when flash light 56 strikes radiation-absorbing material 22. This heats organic material 30 in the immediate vicinity of radiation-absorbing material 22 in a patterned layer. Organic material 30 is drawn for clarity as a single layer, but it will be understood that it represents a multilayer coating as described herein, e.g. a dopant layer 20 disposed over a host material layer 18. In this embodiment, only a portion of the light impinging on donor element 12 (i.e. that which impinges directly on radiation-absorbing material 22) will be converted to heat. Some or all of the heated portion of organic material 30 is sublimed, vaporized, or ablated and becomes transferred organic material 52 on receiving surface 46 of substrate 38 in a patterned transfer.

This process can be effected in such a way that provides a reduced pressure atmosphere in gap 54 between donor element 12 and substrate 38. An apparatus that can accomplish this has been described by Phillips, et al. in commonly assigned U.S. patent application Ser. No. 10/021,410 filed Dec. 12, 2001, entitled "Apparatus for Permitting Transfer of Organic Material From a Donor to Form a Layer in an OLED Device", the disclosure of which is herein incorporated by reference. By reduced pressure atmosphere, we mean a pressure of 1 Torr or less, wherein the mean free path, which is the average distance traveled by gaseous molecules between collisions with other gaseous molecules, is greater than the gap distance between donor element 12 and substrate 38. This means that material crossing gap 54 will have a low probability of colliding with any residual gases.

Figure 3:
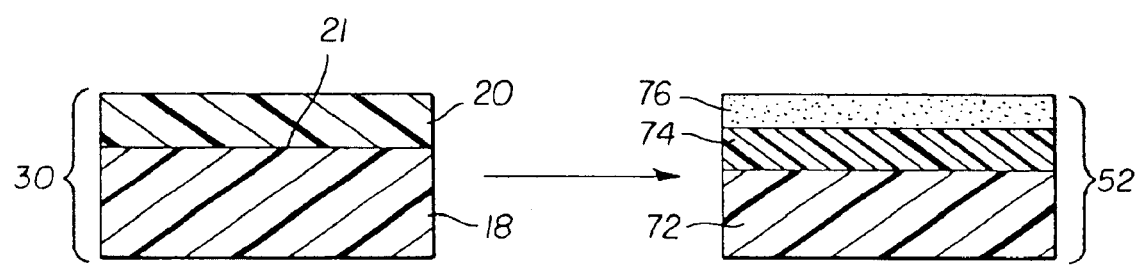
FIG. 3 shows a cross-sectional representation of the manner in which the dopant material is mixed into the host material.

Turning now to FIG. 3, there is shown a cross-sectional representation of the manner in which the dopant material is mixed into the host material when the dopant material and host material undergo vaporization transfer and are deposited on the substrate. Host material layer 18 and dopant layer 20 are transferred and deposited on the substrate, forming transferred host material layer 72, transferred dopant layer 76, and mixed layer 74. Mixed layer 74 is formed from the dopant layer 20 and host material layer 18 at interface 21 between the dopant and host materials. The mixing of dopant material and host material can be partial mixing or full mixing.

Figure 4:
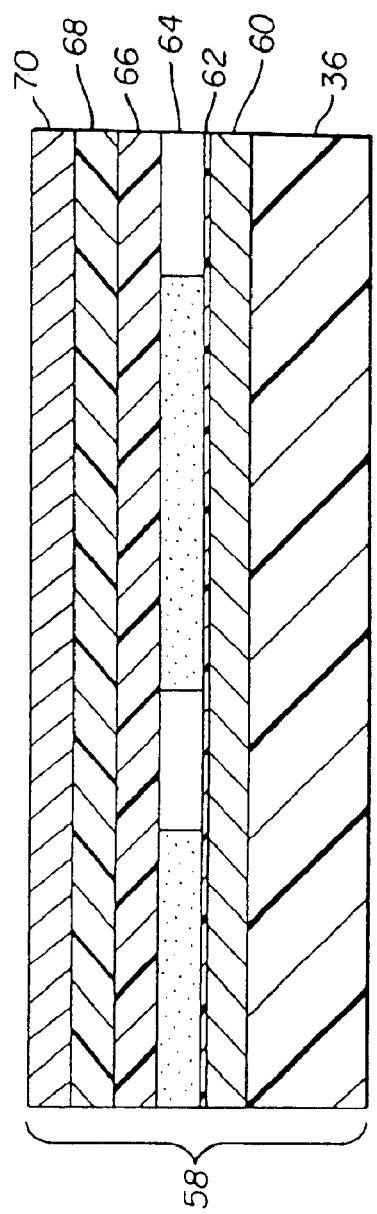
FIG. 4 shows a cross-sectional representation of the structure of an example OLED device.

Turning now to FIG. 4, there is shown in cross-sectional view an example of the structure of the emissive portion of an OLED device. OLED device 58 is formed on substrate 36, which is coated in the region of interest with anode layer 60. The conductive anode layer is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

OLED device 58 can further include hole-injecting layer 62. While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

OLED device 58 further includes hole-transporting layer 64. Hole-transport layer 64 can include any of the above-described hole-transporting materials. Desired hole-transporting materials can be deposited by any suitable means such as evaporation, sputtering, chemical vapor deposition, or electrochemical means. Hole-transporting materials can be patterned using well known photolithographic processes.

OLED device 58 further includes emissive layer 66, which can be deposited by the techniques of this invention. Useful organic emissive materials are well known. As more fully described in U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material as previously described, a hole-transporting material as previously described, or another material that supports hole-electron recombination. The dopant material contained in the host material is as previously described.

OLED device 58 further includes electron-transporting layer 68. Desired electron-transporting materials can be deposited by any suitable means such as evaporation, sputtering, chemical vapor deposition, or electrochemical means. Electron-transporting materials can be patterned using well known photolithographic processes. Preferred electron-transporting materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (G), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (I) are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers,* Vols. 1–4, H. S. Nalwa, ed., John Wiley and Sons, Chichester (1997).

OLED device 58 further includes cathode 70. When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser transfer, and selective chemical vapor deposition.

Figure 5:
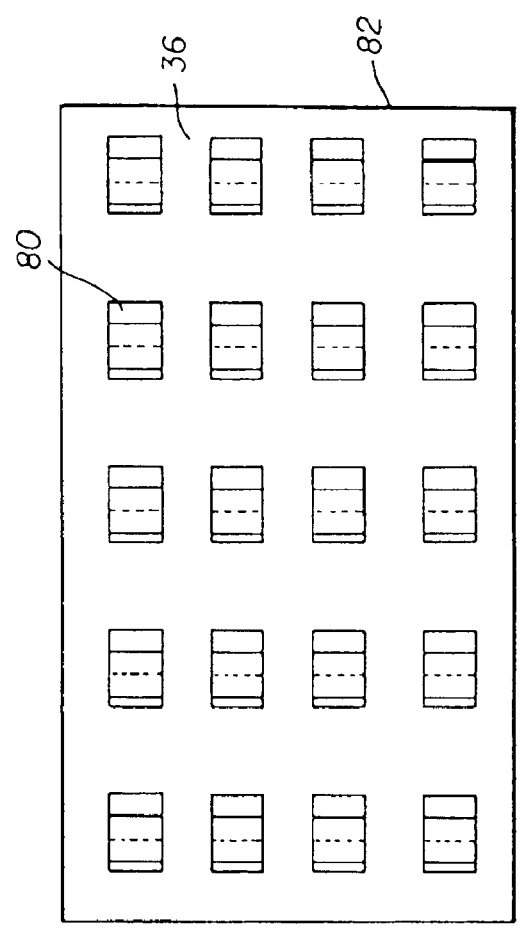
FIG. 5 shows a plan view of a substrate prepared in accordance with this invention.

Turning now to FIG. 5, and referring also to FIGS. 2a and 2b, there is shown a plan view of treated substrate 82, which has been treated in the manner described in this invention. Predetermined portions of organic material 30 have been transferred to substrate 36 in transferred pattern 80. Transferred pattern 80 has been formed in a manner consistent with the end-use of treated substrate 82 (e.g. transferred pattern 80 is of an OLED light-emissive material that has been transferred to the positions of existing thin-film transistors on substrate 36). Transferred pattern 80 reflects the method used to prepare it (e.g. radiation-absorbing material 22 in a patterned layer in FIG. 2b or the pattern of laser light 48 irradiation in FIG. 2a).

The invention and its advantages can be better appreciated by the following comparative examples.

DONOR ELEMENT EXAMPLE 1

A donor element satisfying the requirements of the invention was constructed in the following manner:
1. An absorption layer of 30 nm of chromium was vacuum-deposited onto a 125 micron polyimide donor substrate with a mild texture of about 2 microns height.
2. A layer of 20 nm of 2-tert-butyl-9,10-bis(2-naphthyl) anthracene (TBADN) was vacuum deposited onto the chromium layer, followed by a second layer of 0.25 nm of tetra-tert-butyl-perylene (TBP).

OLED DEVICE EXAMPLE 1

An OLED device satisfying the requirements of the invention was constructed in the following manner:
1. Onto a clean glass OLED substrate, a pattern of 40 to 80 nm transparent electrodes was vacuum-deposited through a mask with indium tin oxide.

2. The resulting surface was treated with a plasma oxygen etch, followed by plasma deposition of ~0.1 nm of $CF_x$.
3. A 170 nm hole-transport layer of NPB was vacuum deposited onto the surface.
4. The donor element prepared in donor element Example 1 was placed on top of the NPB layer and held in proximal contact using vacuum. A small gap of approximately one micron was maintained by the texture of the donor substrate. In regions of the OLED substrate in which emission is desired, transfer of the emissive material from the donor element was effected by irradiation through the polyimide substrate with an infrared laser beam. The beam size was approximately 23 microns by 80 microns to the $1/e^2$ intensity point. The beam was scanned in a direction perpendicular to the long dimension of the beam. The dwell time was 29 microseconds with an energy density of 0.68 $J/cm^2$.
5. An electron-transport layer 35 nm of tris(8-hydroxyquinoline)aluminum (ALQ) was vacuum deposited onto the emissive layer.
6. An electrode was formed over the electron-transport layer by codepositing 20 nm silver and 200 nm magnesium by vacuum deposition.

DONOR ELEMENT EXAMPLE 2

A comparative donor element was constructed in the manner described for donor element Example 1, except in step 2, 20 nm of TBADN and 0.25 nm of TBP were vacuum codeposited onto the chromium layer to form a mixed donor.

OLED DEVICE EXAMPLE 2

A comparative OLED device was constructed in the manner described for OLED device Example 1, except the donor element prepared in donor element example 2 was used in step 4.

OLED DEVICE EXAMPLE 3

A comparative OLED device was constructed in the manner described for OLED device Example 1, except that step 4 was as follows:
4. A layer of 0.25 nm of TBP was vacuum deposited onto the NPB layer, followed by a second layer of 20 nm TBADN.

OLED DEVICE EXAMPLE 4

A comparative OLED device was constructed in the manner described for OLED device Example 3 except in step 4, 20 nm of TBADN and 0.25 nm of TBP were vacuum codeposited onto the NPB layer to form a mixed layer.

Device testing consisted of putting a constant current through the constructed OLED device and monitoring the light output. The blue dopant emission was detected by observing the emission spectra for the characteristic 3-peaked emission from TBP, with the strongest peak located at about 464 nm. TBADN emission is a single-peak emission at 456 nm, ~CIE (0.16, 0.12). The results are shown in Table 1.

TABLE 1

| Example # | Example Type | CIE X | CIE Y | Luminance at 20 $mA/cm^2$ ($cd/m^2$) | Dopant Emission? |
|---|---|---|---|---|---|
| 1 | invention | 0.159 | 0.210 | 314 | Yes |
| 2 | Donor control | 0.159 | 0.209 | 350 | Yes |
| 3 | Double-layer control | 0.163 | 0.124 | 252 | Minimal |
| 4 | Mixed-layer control | 0.162 | 0.216 | 358 | Yes |

DONOR ELEMENT EXAMPLE 3

A donor element satisfying the requirements of the invention was constructed in the manner described for donor element Example 1, except step 2 was as follows:
2. A layer of 20 nm of ALQ was vacuum deposited onto the chromium layer, followed by a second layer of 0.4 nm of 4-(dicyanomethylene)-2-t-butyl-6-(1,1,7,7-tetramethyljulolidyl-9-enyl)-4H-pyran (DCJTB).

OLED DEVICE EXAMPLE 5

An OLED device satisfying the requirements of the invention was constructed in the manner described for OLED device Example 1, except in step 4 the donor element prepared in donor element Example 3 was used, and a gap of 75 microns was maintained by the use of a metal shim spacer between the donor element and the OLED substrate.

DONOR ELEMENT EXAMPLE 4

A comparative donor element was constructed in the manner described for donor element Example 3, except in step 2, 20 nm of ALQ and 0.4 nm of DCJTB were vacuum codeposited onto the chromium layer to form a mixed donor.

OLED DEVICE EXAMPLE 6

A comparative OLED device was constructed in the manner described for OLED device Example 5, except the donor element prepared in donor element example 4 was used in step 4.

OLED DEVICE EXAMPLE 7

A comparative OLED device was constructed in the manner described for OLED device Example 1, except that step 4 was as follows:
4. A layer of 0.4 nm of DCJTB was vacuum deposited onto the NPB layer, followed by a second layer of 20 nm ALQ.

OLED DEVICE EXAMPLE 8

A comparative OLED device was constructed in the manner described for OLED device Example 7 except in step 4, 20 nm of ALQ and 0.4 nm of DCJTB were vacuum codeposited onto the NPB layer to form a mixed layer.

Device testing consisted of putting a constant current through the constructed OLED device and monitoring the light output. Red DCJTB dopant emission was easily detected as a separate peak from the host ALQ green emission. The results are shown in Table 2.

TABLE 2

| Example # | Example Type | CIE X | CIE Y | Luminance at 20 mA/cm (cd/m²) | Dopant Emission? |
|---|---|---|---|---|---|
| 5 | invention | 0.58 | 0.40 | 300 | Yes |
| 6 | Donor control | 0.63 | 0.37 | 192 | Yes |
| 7 | Double-layer control | 0.42 | 0.51 | 157 | Some |
| 8 | Mixed-layer control | 0.64 | 0.36 | 319 | Yes |

It is clear that when the dopant is evaporatively deposited as a separate layer in a standard OLED device it does not function as a major emissive source, and much or all of the emission comes from the host (Examples 3,7). To be effectively utilized as an emissive site, the dopant must be effectively mixed into the host. Unexpectedly, layered donors mix sufficiently upon radiation transfer to give good color and efficient luminance. Radiation transfer gives a transferred emissive layer from a donor with the dopant in a separate layer (Examples 1,5) which is similar to donor with a dopant mixed with the host material, either transferred from a donor (Examples 2, 6) or deposited directly to the OLED device (Examples 4, 8).

The invention has been described in detail with particular reference to certain preferred embodiments thereof, but it will be understood that variations and modifications can be effected within the spirit and scope of the invention.

PARTS LIST 10 donor element
12 donor element
14 donor support element
16 light-absorbing layer
18 host material layer
20 dopant layer
21 interface
22 radiation-absorbing patterned layer
30 organic material
32 non-transfer surface
34 transfer surface
36 substrate
38 substrate
40 thin-film transistor
42 raised surface portion
44 gap
46 receiving surface
48 laser light
49 laser source
50 heat
52 transferred organic material
54 gap
56 flash light
58 OLED device
60 anode layer
62 hole-injecting layer
64 hole-transporting layer
66 emissive layer PARTS LIST (con't)

68 electron-transporting layer
70 cathode
72 transferred host material layer
74 mixed layer
76 transferred dopant layer
80 transferred pattern
82 treated substrate

What is claimed is:

1. A donor element adapted for use in making an OLED device, comprising:
    a) a donor support element;
    b) a light-absorbing layer disposed over the donor support element which, in response to light, produces heat;
    c) a host material layer disposed over the light-absorbing layer; and
    d) a dopant layer disposed over the host material layer such that when the donor element is placed in a transfer relationship with the OLED device and when light is absorbed by the light-absorbing layer, heat is produced that causes the vaporization transfer of host materials and dopant materials from the light-absorbing layer to cause at least partial mixing in the OLED device.

2. The donor element of claim 1 further including two or more host materials in the host material layer or in another layer.

3. The donor element of claim 1 wherein the dopant layer is disposed directly on the host material layer.

4. The donor element of claim 3 wherein the dopant layer has a thickness which is in a range of from 0.01% to 10% of the host material layer thickness.

5. A donor element adapted for use in making an OLED device, comprising:
    a) a donor support element;
    b) a light-absorbing layer disposed on the donor support element which, in response to light, produces heat;
    c) one or more host material layers disposed on the light-absorbing layer; and
    d) a dopant layer disposed on the host material layer such that when the donor element is placed in a transfer relationship with the OLED device and when light is absorbed by the light-absorbing layer, heat is produced that causes the vaporization transfer of host materials and dopant materials from the light-absorbing layer to cause at least partial mixing in the OLED device.

6. A method of using the donor element of claim 1 in the process of making an OLED device, comprising the steps of:
    a) positioning the donor element in a transfer relationship with an OLED substrate and spaced from such OLED substrate by a gap; and
    b) illuminating the donor element with light which is sufficient to cause enough heat to be formed such that dopant material and host material are respectively deposited on the substrate with the dopant material being mixed into the host material at the interface between the dopant and host materials.

7. The method of claim 6 wherein the light is provided by a laser source.

8. The method of claim 7 wherein the laser light is from an infrared laser.

9. The method of claim 6 further including providing a reduced pressure atmosphere in the gap between the donor element and the OLED substrate.

10. The method of claim 9 wherein the pressure is such that the mean free path is greater than the gap between the donor element and the substrate.

11. A method of using the donor element of claim 5 in the process of making an OLED device, comprising the steps of:

a) positioning the donor element in a transfer relationship with an OLED substrate and spaced from such OLED substrate by a gap; and b) illuminating the donor element with light which is sufficient to cause enough heat to be formed such that dopant material and host material are respectively deposited on the substrate with the dopant material being mixed into the host material at the interface between the dopant and host materials.

12. The method of claim 11 wherein the light is provided by a laser source.

13. The method of claim 12 wherein the laser light is from an infrared laser.

14. The method of claim 11 further including providing a reduced pressure atmosphere in the gap between the donor element and the OLED substrate.

15. The method of claim 14 wherein the pressure is such that the mean free path is greater than the gap between the donor element and the substrate.

* * * * *